(12) United States Patent
Lee

(10) Patent No.: US 8,153,976 B2
(45) Date of Patent: Apr. 10, 2012

(54) INFRARED SENSOR AND MANUFACTURING METHOD THEREOF

(75) Inventor: Tzong-Sheng Lee, Zhunan Township, Miaoli County (TW)

(73) Assignee: Unimems Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 12/958,556

(22) Filed: Dec. 2, 2010

(65) Prior Publication Data

US 2012/0049066 A1  Mar. 1, 2012

(30) Foreign Application Priority Data

Aug. 30, 2010 (TW) ................................ 99129070 A

(51) Int. Cl.
*G01J 5/00* (2006.01)
(52) U.S. Cl. .................................................. 250/338.1
(58) Field of Classification Search .......... 250/330–335, 250/336.1–336.2, 337, 338.1–338.5, 339.01–339.15, 250/340, 341.1–341.8
See application file for complete search history.

(56) References Cited

U.S. PATENT DOCUMENTS

| 4,001,586 | A | * | 1/1977 | Fraioli | 250/345 |
| 5,397,897 | A | * | 3/1995 | Komatsu et al. | 250/338.4 |
| 5,693,942 | A | * | 12/1997 | Endo et al. | 250/338.1 |
| 5,962,854 | A | * | 10/1999 | Endo | 250/349 |
| 7,511,274 | B2 | * | 3/2009 | Johnson et al. | 250/338.1 |

* cited by examiner

*Primary Examiner* — Kiho Kim
(74) *Attorney, Agent, or Firm* — C. G. Mersereau; Nikolai & Mersereau, P.A.

(57) ABSTRACT

A manufacturing method for an infrared sensor includes the following steps: providing a wafer having several chips and a substrate; forming four soldering portions, a thermistor, and an infrared sensing layer on the bottom surface of each chip, wherein the soldering portions are connected electrically to the thermistor and the infrared sensing layer; disposing a soldering material onto at least one bonding location for each soldering portion; backside-etching each chip of the wafer to form a sensing film and a surrounding wall around the sensing film; bonding the wafer and the substrate; heating the soldering materials to connect the substrate and each chip of the wafer; disposing an infrared filter on the surrounding wall of each chip; cutting the wafer and the substrate to form a plurality of individual infrared sensors. The instant disclosure further provides an associated infrared sensor.

17 Claims, 6 Drawing Sheets

INFRARED SENSOR AND MANUFACTURING METHOD THEREOF

BACKGROUND OF THE INVENTION

1. Field of the Invention

The instant disclosure relates to an infrared sensor and manufacturing method thereof; in particular, a miniature infrared sensor and the manufacturing method thereof.

2. Description of Related Art

References are made to FIGS. 1 and 2, which illustrate a conventional infrared sensor having a base 1a, a plurality of pins 2a, a chip 3a, a plurality of wires 4a, a cover 5a, an infrared filter 6a, and a thermistor 7a.

The base 1a has a plurality of thru holes 11a. The pins 2a are respectively arranged in the thru holes 11a of the base 1a. The chip 3a has a sensing film 31a in the center location thereon and a surrounding wall 32a surrounding the sensing film 31a. The surrounding wall 32a defines a downward-facing opening 321a in the bottom surface of the chip 3a. The surrounding wall 32a is mounted on the base 1a. The thermistor 7a is disposed on the base 1a. Wires 4a connect the upper surface of the surrounding wall 32a and the thermistor 7a to the pins 2a on the base 1a. The cover 5a is mounted on the base 1a to enclose the chip 3a. The cover 5a has a mounting seat 51a located above the sensing film 31a of the chip 3a. The infrared filter 6a is then mounted onto the mounting seat 51a of the cover 5a.

For the above configuration, a wafer (not shown) having several marked chip patterns is first prepared. Each chip pattern is back-etched to form the concaved structure on the chip. Next, the wafer is cuffed to obtain a plurality of individual chips 3a.

The chip 3a is then bonded onto the base 1a by a flip chip bonder (not shown). After the pins 2a and the thermistor 7a are set as described earlier, a wire bonder (not shown) is used to wire the chip 3a and the thermistor 7a to the pins 2a respectively. Lastly, the cover 5a having the infrared filter 6a is mounted onto the base 1a to enclose the chip 3a.

In the conventional infrared sensor, the incoming infrared light passes through the infrared filter 6a and is adsorbed by the sensing film 31a. However, the distance between the infrared filter 6a and the sensing film 31a is often too large, which can lead to light interference known as the crosstalk condition. Further, the conventional sensor must be manufactured individually after individual chips are cut from the wafer. Furthermore, separate processes are required to dispose the pins into the base 1a, to mount the filter 6a onto the cover 5a, and to dispose the thermistor 7a onto the base 1a. Thus, the associated manufacturing cost is high.

Therefore, one aspect of the instant disclosure is to provide an infrared sensor that addresses the aforementioned problems.

SUMMARY OF THE INVENTION

The main object of the instant disclosure is to provide an infrared sensor and manufacturing methods thereof, where the infrared sensor can avoid crosstalk condition with high-sensitivity, has a lower manufacturing cost, and smaller in size.

The infrared sensor comprises a chip having a sensing film in the center thereof and a surrounding wall, wherein the sensing film has an infrared sensing layer. A cavity is formed at the top of the chip, and four soldering portions and a thermistor are formed on the bottom surface thereon; two of the soldering portions are connected electrically to the thermistor, while the other two soldering portions are connected electrically to the infrared sensing layer. An infrared filter is disposed in the cavity of the chip.

The manufacturing method for an infrared sensor in accordance with the instant disclosure comprises the steps of: providing a substrate and a wafer having a plurality of embedded chips; forming an infrared sensing layer inside each chip; forming four soldering portions and a thermistor on the bottom of each chip, where two of the soldering portions are electrically connected to the thermistor, and the other two soldering portions are electrically connected to the infrared sensing layer, where each soldering portion has at least one bonding location; fixing a soldering material onto each soldering portion; forming a sensing film and a cavity by backside etching at the top surface of each chip; fixing the soldering material onto the thermistor and at least one bonding location for each soldering portion; heating the soldering materials for bonding each chip to the substrate; disposing an infrared filter into the cavity of each chip; and cutting the wafer and the substrate to separate each chip assembly in forming individual infrared sensor.

An alternative manufacturing method comprises the steps of: providing a substrate and a wafer having a plurality of embedded chips; forming an infrared sensing layer inside each chip; forming four soldering portions and a thermistor on the bottom of each chip, where two of the soldering portions are electrically connected to the thermistor, and the other two soldering portions are electrically connected to the infrared sensing layer, where each soldering portion has at least one bonding location; fixing a soldering material onto each soldering portion; forming a sensing film and a cavity by backside etching at the top surface of each chip; cutting the wafer to separate the embedded chips; fixing the soldering material onto the thermistor and at least one bonding location for each soldering portion; heating the soldering materials for bonding each separated chip to the substrate; disposing an infrared filter into the cavity of each chip; and cutting the substrate for each bonded chip in forming individual infrared sensor.

The infrared sensor of the instant disclosure has several advantages. First, the infrared sensor can be manufactured with mass production at low cost per unit. Secondly, the infrared sensor is constructed to prevent crosstalk condition of the incoming infrared light. Thirdly, the size of the infrared sensor is reduced. In addition, the material costs for the infrared sensor can be reduced effectively. Furthermore, the infrared sensor can be used with miniature devices like cell phones, ear thermometers, sensing devices, and so on.

For further understanding of the instant disclosure, reference is made to the following detailed description illustrating the embodiments and examples of the instant disclosure. The description is for illustrative purpose only and is not intended to limit the scope of the claims.

DETAILED DESCRIPTION OF THE PREFERRED EMBODIMENTS

Figure 7:
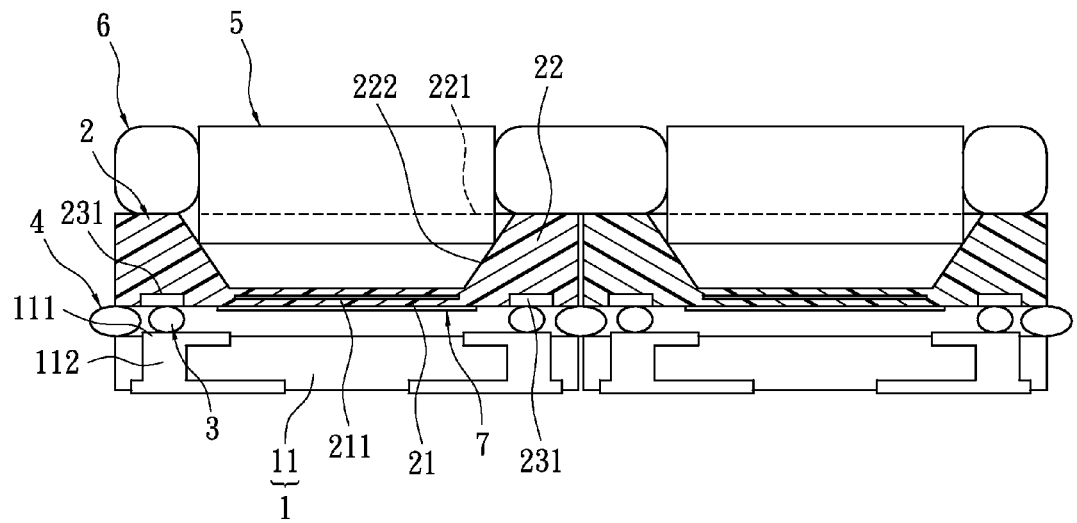
FIG. 7 is a cross-sectional view of an infrared sensor having a sloped surface, showing a sensing film coated with a reflective layer.

Please refer to FIG. 7, which shows a cross-sectional view of an infrared sensor for the first embodiment of the instant disclosure. The infrared sensor comprises a substrate 1, a chip 2, a plurality of soldering materials 3, an infrared filter 5, and a reflective layer 7. The soldering materials 3 provide bonding between the substrate 1 and the chip 2, and the infrared filter 5 is disposed onto the chip 2.

In FIG. 7, the substrate 1 is a circuit board 11 but can be other materials, such as a ceramic plate or a silicon wafer. The circuit board 11 has four contacting members 111 formed on the upper surface thereof. The contacting members 111 also extend downwards in forming four electrical circuits 112, for establishing electrical connection between the top and the bottom surface of the circuit board 11. Based on the operation requirement, the number of the contacting member 111 and the electrical circuit 112 can be varied. The soldering materials 3 are fixed onto the contacting members 111.

Figure 1:
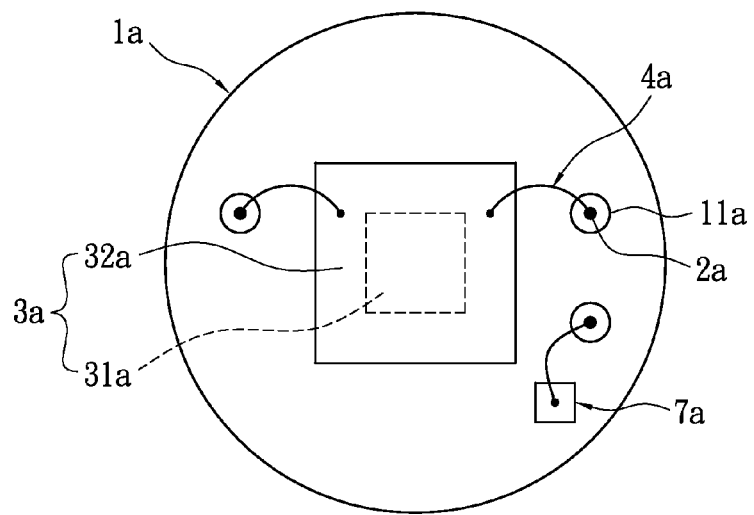
FIG. 1 is a schematic view of the infrared sensor of the related art.
Figure 2:
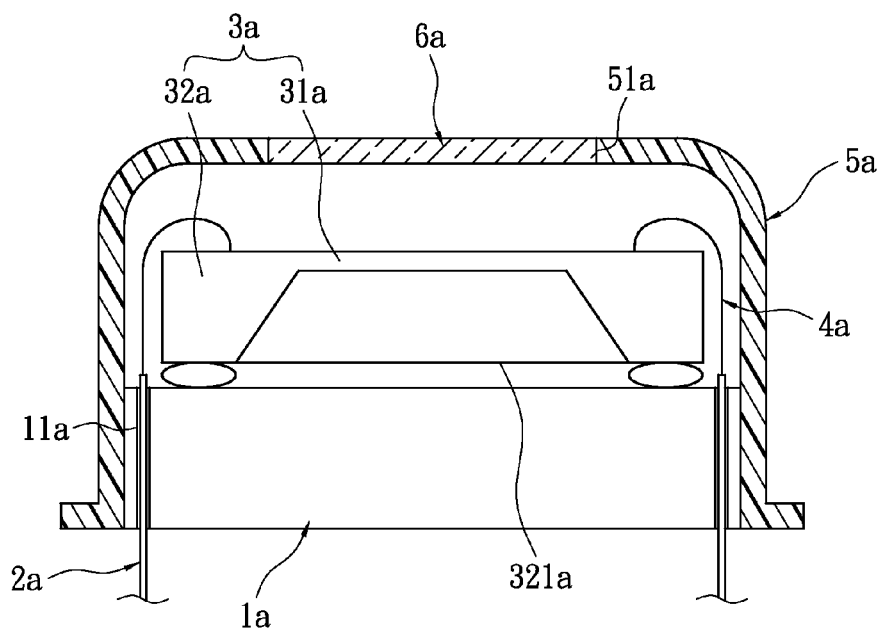
FIG. 2 is a cross-sectional view of the infrared sensor of the related art.
Figure 3:
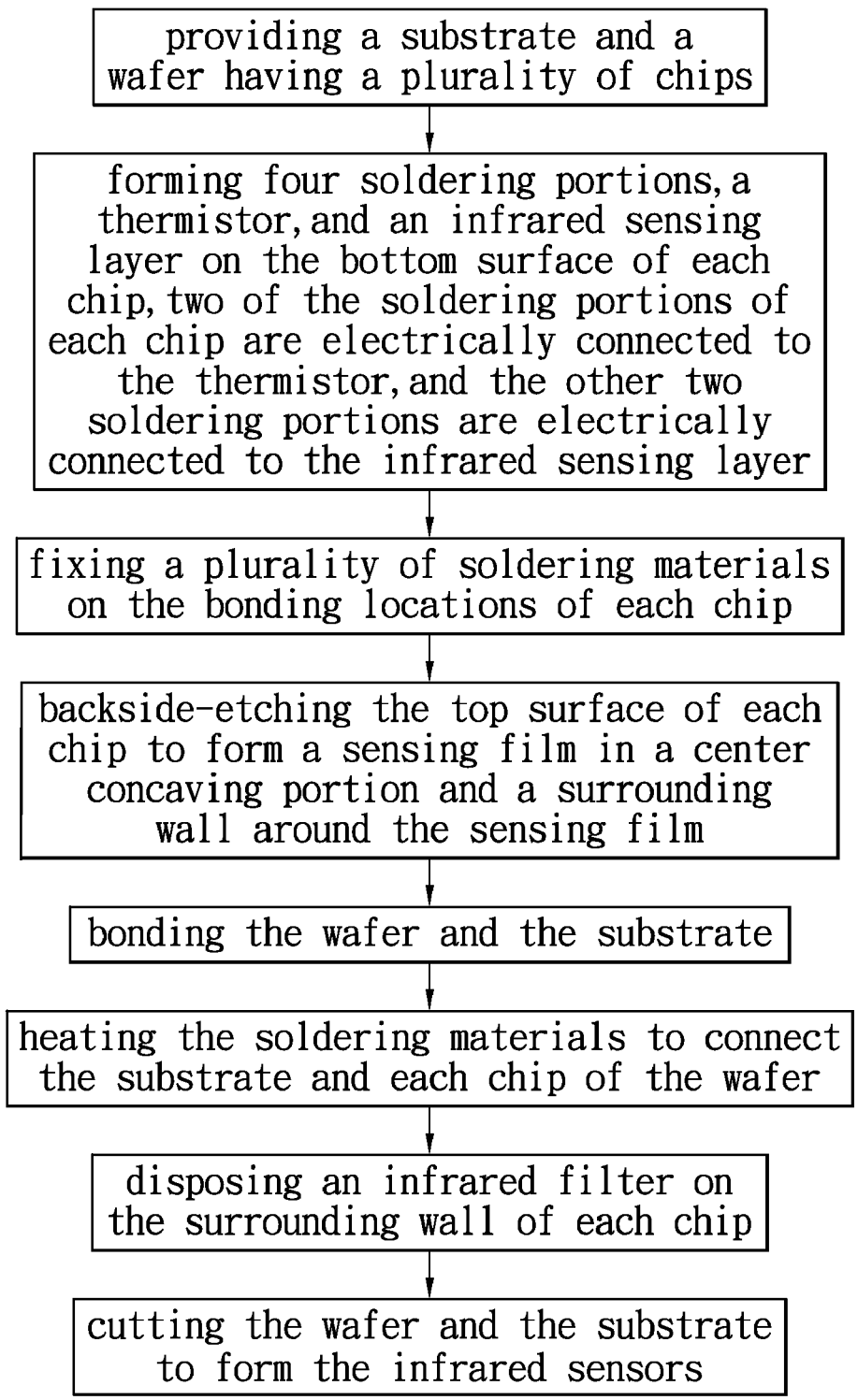
FIG. 3 is a flow diagram illustrating the first manufacturing method of an infrared sensor for the instant disclosure.
Figure 4:
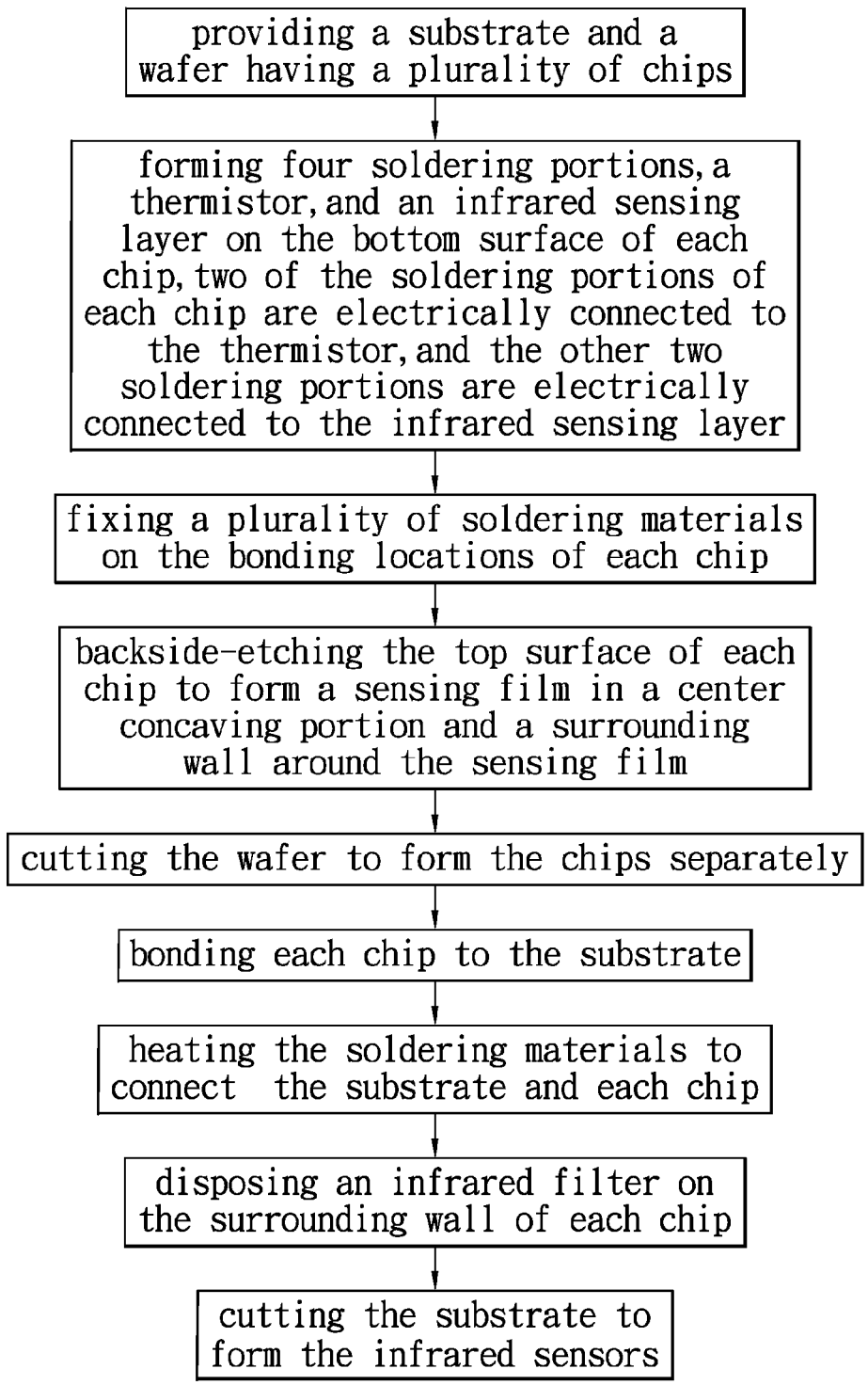
FIG. 4 is a flow diagram illustrating the second manufacturing method of an infrared sensor for the instant disclosure.
Figure 5:
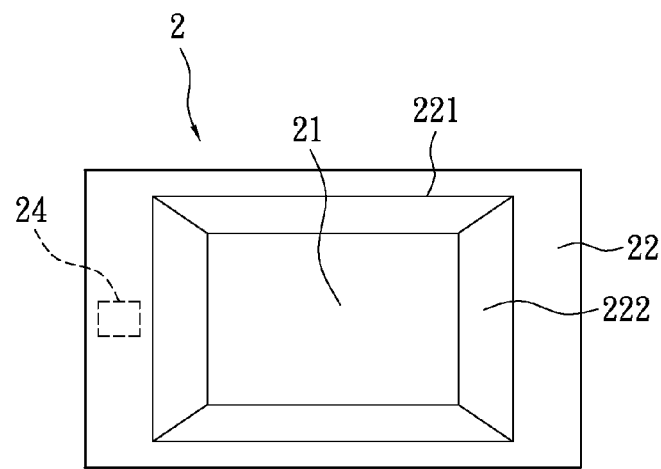
FIG. 5 is a top view of a chip of the instant disclosure.
Figure 6:
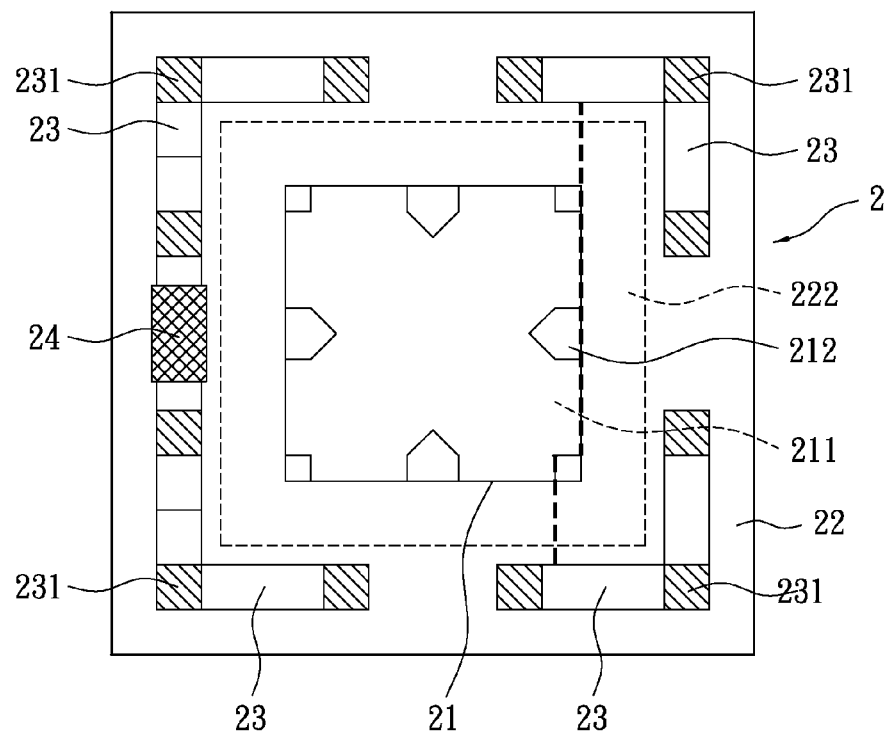
FIG. 6 is a bottom view of a chip of the instant disclosure.

Structurally, the chip 2 is concaved at the center thereof. A sensing film 21 is formed at the bottom of the cavity, where the cavity is defined by four side walls in forming a surrounding wall 22 around the sensing film 21. An opening 221 is defined by the surrounding wall 22, which has a sloped surface 222. An infrared sensing layer 211 is formed inside the sensing film 21. Please also refer to FIGS. 5 and 6, where four soldering portions 23 and a thermistor 24 are formed at the bottom surface of the chip 2. The thermistor 24 is connected electrically to two of the soldering portions 23, while the other two soldering portions 23 are connected electrically to the infrared sensing layer 211. The number of the soldering portion 23 can be varied based on the operation requirement, and at least one bonding location 231 is formed on each soldering portion 23. As illustrated in FIG. 6, the sensing film 21 can further have a plurality of holes 212 formed on the outer edges thereof, to prevent the sensing film 21 from rupturing due to thermal expansion when heated.

Figure 8:
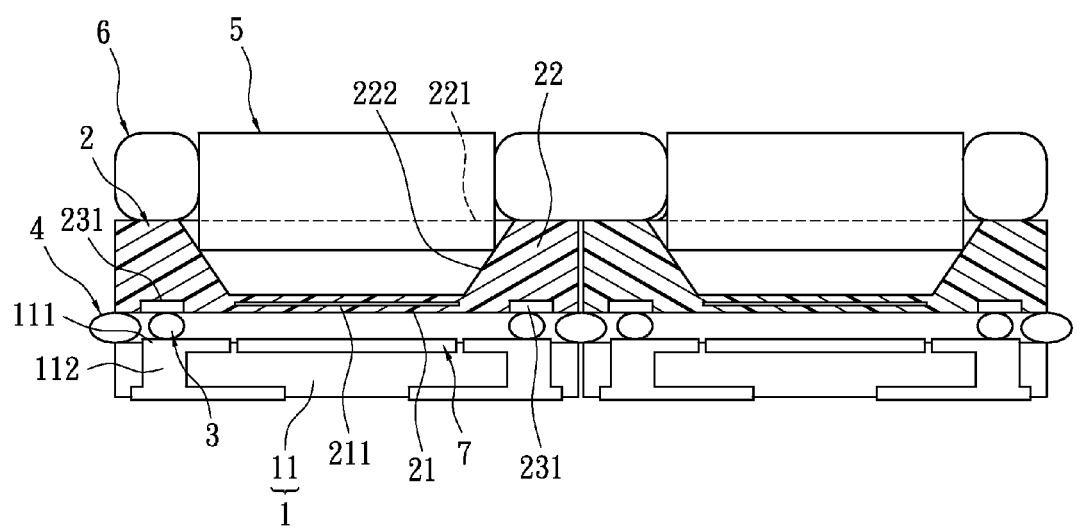
FIG. 8 is a cross-sectional view of an infrared sensor having a sloped surface, showing a circuit board coated with a reflective layer.

As shown in FIG. 7, the soldering material 3, such as a tin ball, is disposed respectively in between the contacting members 111 and the bonding locations 231. The infrared filter 5 is disposed on the sloped surface 222 of the chip 2. Meanwhile, the reflective layer 7 can be coated on the bottom surface of the sensing film 21 (shown in FIG. 7) or on the top surface of the circuit board 11 (shown in FIG. 8).

In addition, the instant embodiment can further include a plurality of first adhesives 4 and a plurality of second adhesives 6. For gluing the chip 2 to the circuit board 11, the first adhesive 4 is disposed in between the top surface of the circuit board 11 and the bottom surface of the chip 2. By sealing the space in between the chip 2 and the circuit board 11, the adverse moisture effect can be reduced. The second adhesive 6 is disposed on the top surface of the chip 2 and adjoining to the infrared filter 5 for gluing the infrared filter 5 to the chip 2. Both the first and second adhesive 4 and 6 can be a silica gel.

Figure 9:
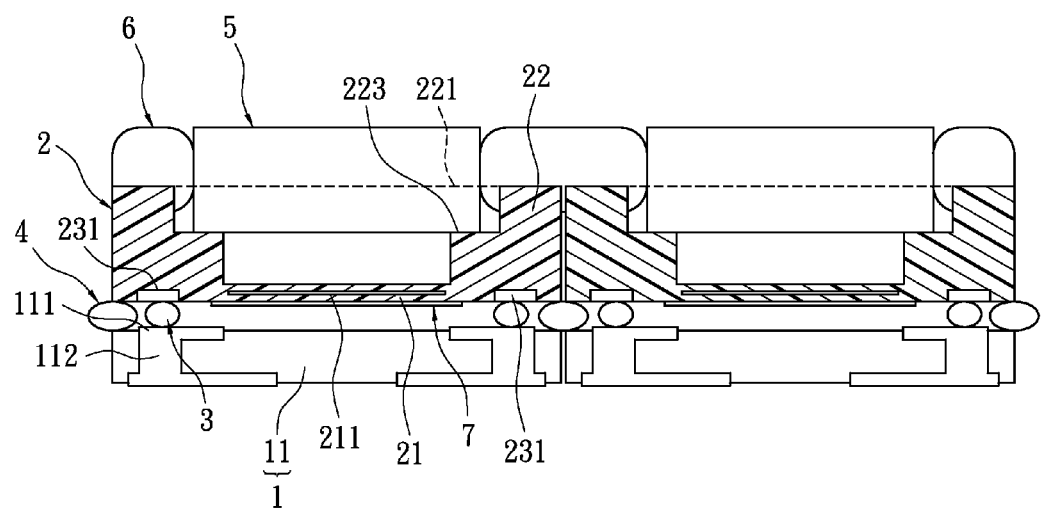
FIG. 9 is a cross-sectional view of an infrared sensor having a stepped surface, showing a sensing film coated with a reflective layer.
Figure 10:
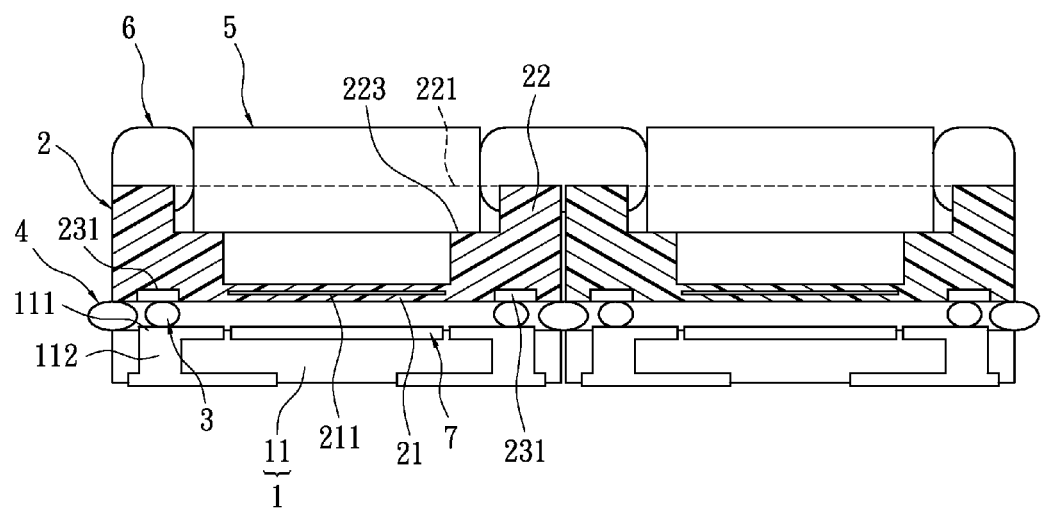
FIG. 10 is a cross-sectional view of an infrared sensor having a stepped surface, showing a circuit board coated with a reflective layer.

Please refer to FIG. 9, which shows a cross-sectional view of an infrared sensor for the second embodiment of the instant disclosure. Instead of a sloped surface for the chip as in the first embodiment, the infrared sensor for the second embodiment has a stepped surface 223. The infrared filter 5 is disposed on the stepped surface 223 accordingly. Like before, a reflective layer 7 can be disposed on the bottom surface of the sensing film 21 as in FIG. 9 or at the top surface of the circuit board 11 as in FIG. 10.

A manufacturing method of the infrared sensor is explained here with reference to FIG. 3 and FIGS. 5 to 10. First, a wafer having a plurality of embedded chips 2 and a substrate 1 are provided. The substrate 1 can be a circuit board 11, a ceramic plate, or a silicon wafer.

The second step is forming four soldering portions 23, a thermistor 24, and an infrared sensing layer 211 on the bottom surface of each chip 2. In particular, the thermistor 24 is formed by the thin-film deposition process. Two of the soldering portions 23 of each chip 2 are electrically connected to the thermistor 24, and the other two soldering portions 23 on each chip 2 are electrically connected to the infrared sensing layer 211. Specifically, the four soldering portions 23 are formed outside of the infrared sensing layer 211, and each soldering portion 23 has at least one bonding location 231. The number of the soldering portion 23 and the bonding location 231 can be varied based on the operation needs.

For step 3, a soldering material 3 is disposed onto each bonding location 231 for each soldering portion 23 respectively or to at least one bonding location 231 for each soldering portion 23.

Step 4 involves forming a sensing film 21 and a cavity defined by a surrounding wall 22 around the sensing film 21 via the backside-etching process over the top surface of each chip 2. The sensing film 21 encloses the infrared sensing layer 211, and a plurality of holes 212 can be formed at the outer edges of the sensing film 21. The surface of the surrounding wall 22 can be either sloped or stepped. For a stepped wall surface, the top surface of the chip 2 must be micro-machined by two backside-etching processes.

Before bonding the wafer to the substrate 1, a reflective layer 7 can be coated over the bottom surface of the chip 2 or the top surface of the substrate 1.

For step 5, a first adhesive 4 is disposed over the substrate 1, and a flip-chip bonder (not shown) is used to align and adjoin the wafer to the substrate 1.

For step 6, the soldering materials 3 are heated to solder each chip 2 of the wafer onto the substrate 1.

For step 7, the flip-chip bonder is reused to dispose an infrared filter 5 onto the surrounding wall 22 of each chip 2 respectively. A second adhesive 6 is disposed on the top surface of each chip 2 for gluing the infrared filter 5 to the chip 2.

Lastly, or step 8, the wafer and the substrate 1 are cut to separate each chip 2 in forming the individual infrared sensor.

A second manufacturing method of the infrared sensor is explained below in reference to FIG. 4 to 10. For step 1 thru 4, the procedures are the same as in the first manufacturing method. For step 5, the wafer is cut into a plurality of individual chips 2, and the substrate 1 is coated with a first adhesive 4.

For step 6, each chip 2 is bonded individually onto the substrate 1.

For step 7, a soldering material 3 is added in between each chip 2 and the substrate 1. The soldering materials 3 are then heated to solder each chip 2 to the substrate 1.

In step 8, a flip-chip bonder (not shown) is used to dispose an infrared filter 5 onto the surrounding wall 22 of each chip 2 respectively. To secure the infrared filter 5, a second adhesive 6 is disposed in between the top surface of each chip 2 and the corresponding infrared filter 5 thereof.

Lastly, or step 9, the substrate 1 is cut based on the individual chip 2 thereon to form a plurality of separate infrared sensors.

The infrared sensor of the instant disclosure provides several advantages. First, the infrared sensor can be manufactured with mass production, which saves production costs versus manufacturing each unit individually. Secondly, the sensing film 21 has a plurality of holes 212 formed on the outer edges thereof, which reduces the risk of rupturing by the sensing film 21 due to thermal expansion. Thus, the infrared sensor is better protected. Thirdly, the infrared filter 5 is disposed on the sloped surface 222 of the surrounding wall 22, which reduces the distance between the infrared filter 5 and the sensing film 21. In turn, the crosstalk condition of the incoming infrared light can be prevented. Fourthly, a portion of the infrared filter 5 is disposed in the chip, such that the overall height of the infrared sensor is reduced. Similarly, the use of circuit board 11 in place of the conventional base member and electric pins further reduces the overall size. Additionally, the infrared sensor does not need a cover; the thermistor is formed directly at the bottom of the chip; the conventional base member and electric pins are replaced by the circuit board 11; and the soldering material 3 is used in place of the conventional wires. All of above help to reduce the material costs for the infrared sensor. Meanwhile, when the infrared light passes through the sensing film 21, the reflective layer 7 can reflect the infrared light back to the sensing film 21 for better absorption. Therefore, the sensitivity of the infrared sensor is improved. Further still, without the use of a cover, the size of the infrared sensor is not much larger than the dimension of the chip 2. Moreover, the bottom of the circuit board 11 can be conductive, so the infrared sensor can be used as a surface mount device (SMD). Thus, the infrared sensor can be used with miniature devices such as cell phones, ear thermometers, sensing devices, and so on.

The description above only illustrates specific embodiments and examples of the instant disclosure. The instant disclosure should therefore cover various modifications and variations made to the herein-described structure and operations of the instant disclosure, provided they fall within the scope of the instant disclosure as defined in the following appended claims.

What is claimed is:

1. An infrared sensor, comprising: a chip having a sensing film and a surrounding wall around the sensing film, wherein the sensing film has an infrared sensing layer; the surrounding wall defines an opening on the chip surface, and the chip has a plurality of soldering portions and a thermistor formed on the bottom surface, wherein the soldering portions are connected electrically to the thermistor and the infrared sensing layer, each soldering portion has at least one bonding location; and an infrared filter disposed on the surface of the surrounding wall of the chip.

2. The infrared sensor of claim 1, wherein the surrounding wall has a sloped surface.

3. The infrared sensor of claim 1, wherein the surrounding wall has a stepped surface.

4. The infrared sensor of claim 1, wherein a plurality of holes are formed at the outer edges of the sensing film.

5. The infrared sensor of claim 1, further comprising a circuit board having a plurality of contacting members, which form a plurality of electrical circuits for establishing electrical connection between the top and bottom surface of the circuit board; and a plurality of soldering materials are disposed in between the contacting members and the bonding locations.

6. The infrared sensor of claim 5, wherein a reflective layer is disposed on the upper surface of the circuit board.

7. The infrared sensor of claim 1, wherein a reflective layer is disposed at the bottom surface of the chip.

8. A manufacturing method for an infrared sensor, comprising the steps of:
   providing a substrate and a wafer having a plurality of chips;
   forming a plurality of soldering portions, a thermistor, and an infrared sensing layer on the bottom surface of each chip, the soldering portions are electrically connected to the thermistor and the infrared sensing layer, each soldering portion has at least one bonding location;
   disposing a soldering material onto at least one bonding location of each soldering portion;
   backside-etching the top surface of each chip to form a sensing film and a cavity having a surrounding wall around the sensing film;
   bonding the wafer to the substrate;
   heating the soldering materials to secure the wafer to the substrate;
   disposing an infrared filter on the surrounding wall of each chip; and
   cutting the wafer and the substrate to form a plurality of individual infrared sensors.

9. The manufacturing method of an infrared sensor of claim 8, further disposing a reflective layer on the bottom surface of each chip before bonding to the substrate.

10. The manufacturing method of an infrared sensor of claim 8, further disposing a reflective layer on the top surface of the substrate before bonding to the wafer.

11. The manufacturing method of an infrared sensor of claim 8, further disposing a first adhesive on the substrate before bonding to the wafer.

12. The manufacturing method of an infrared sensor of claim 8, further disposing a second adhesive on the top surface of the chip after disposing the infrared filter.

13. A manufacturing method for an infrared sensor, comprising the steps of:
   providing a substrate and a wafer having a plurality of chips;
   forming a plurality of soldering portions, a thermistor, and an infrared sensing layer on the bottom surface of each chip, the soldering portions are electrically connected to the thermistor and the infrared sensing layer, each soldering portion has at least one bonding location;
   disposing a soldering material onto at least one bonding location for each soldering portion;
   backside-etching the top surface of each chip to form a sensing film and a cavity having a surrounding wall around the sensing film;
   cutting the wafer to form the chips separately;
   bonding each chip to the substrate;
   heating the soldering materials to adjoin the substrate and each chip;
   disposing an infrared filter on the surrounding wall of each chip; and
   cutting the substrate to form a plurality of individual infrared sensors.

14. The manufacturing method of an infrared sensor of claim 13, further disposing a reflective layer on the bottom surface of each chip before cutting the wafer.

15. The manufacturing method of an infrared sensor of claim 13, further disposing a reflective layer on the top surface of the substrate before bonding to the chip.

16. The manufacturing method of an infrared sensor of claim 13, further disposing a first adhesive on the substrate before bonding to the chip.

17. The manufacturing method of an infrared sensor of claim 13, further disposing a second adhesive on the top surface of the chip after disposing the infrared filter.

* * * * *